United States Patent
Qin et al.

(10) Patent No.: US 8,063,305 B2
(45) Date of Patent: Nov. 22, 2011

(54) METHOD OF FORMING BENDS IN A WIRE LOOP

(75) Inventors: Ivy Wei Qin, Lansdale, PA (US); Romeo Olida, Chalfont, PA (US)

(73) Assignee: Kulicke and Soffa Industries, Inc., Fort Washington, PA (US)

(*) Notice: Subject to any disclaimer, the term of this patent is extended or adjusted under 35 U.S.C. 154(b) by 422 days.

(21) Appl. No.: 12/377,002

(22) PCT Filed: Apr. 2, 2007

(86) PCT No.: PCT/US2007/065753
§ 371 (c)(1),
(2), (4) Date: Feb. 10, 2009

(87) PCT Pub. No.: WO2008/121142
PCT Pub. Date: Oct. 9, 2008

(65) Prior Publication Data
US 2010/0147552 A1 Jun. 17, 2010

(51) Int. Cl.
*H02G 15/02* (2006.01)
(52) U.S. Cl. .................... 174/84 R; 174/94 R
(58) Field of Classification Search .......... 174/250, 174/251, 252; 257/779, 784, 786; 438/106–108, 438/118, 123, 127
See application file for complete search history.

(56) References Cited

U.S. PATENT DOCUMENTS

| | | | |
|---|---|---|---|
| 4,327,860 A * | 5/1982 | Kirshenboin et al. | 228/180.5 |
| 4,932,584 A * | 6/1990 | Yamazaki et al. | 228/180.5 |
| 5,205,463 A | 4/1993 | Holdgrafer et al. | |
| 5,961,029 A * | 10/1999 | Nishiura et al. | 228/180.5 |
| 5,989,995 A * | 11/1999 | Nishiura et al. | 438/617 |
| 6,036,080 A * | 3/2000 | Takahashi et al. | 228/180.5 |
| 6,062,462 A | 5/2000 | Gillotti et al. | |
| 6,112,974 A * | 9/2000 | Nishiura et al. | 228/180.5 |
| 6,213,378 B1 * | 4/2001 | Singh | 228/110.1 |
| 6,222,274 B1 * | 4/2001 | Nishiura et al. | 257/776 |
| 6,343,733 B1 * | 2/2002 | Nishiura et al. | 228/180.5 |
| 6,414,387 B1 | 7/2002 | Hara et al. | |
| 6,774,494 B2 * | 8/2004 | Arakawa | 257/779 |
| 6,933,608 B2 * | 8/2005 | Fujisawa | 257/738 |
| 2006/0054665 A1 * | 3/2006 | Calpito et al. | 228/180.5 |

FOREIGN PATENT DOCUMENTS

| EP | 1 085 573 B1 | 3/2001 |
|---|---|---|
| EP | 1085573 B1 * | 12/2007 |

OTHER PUBLICATIONS

International Search Report dated Jan. 25, 2008, International Application No. PCT/US2007/065753.

* cited by examiner

*Primary Examiner* — William Mayo, III
(74) *Attorney, Agent, or Firm* — Christopher M. Spletzer, Sr.

(57) ABSTRACT

A method of forming a bend in a wire loop is provided. The method includes the steps of: (1) forming a first bend in the wire loop at a predetermined portion of the wire loop; (2) paying out a length of wire after step (1); and (3) forming a second bend in the wire loop at the predetermined portion after step (2).

9 Claims, 11 Drawing Sheets

METHOD OF FORMING BENDS IN A WIRE LOOP

CROSS REFERENCE TO RELATED APPLICATION

This application claims the benefit of International Application No. PCT/US2007/065753 filed Apr. 2, 2007 the content of which is incorporated herein by reference.

FIELD OF THE INVENTION

The present invention relates to the formation of wire loops, and more particularly, to improved methods of forming bends in wire loops.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

An exemplary conventional wire bonding sequence includes: (1) forming a free air ball on an end of a wire extending from a bonding tool; (2) forming a first bond on a die pad of a semiconductor die using the free air ball; (3) extending a length of wire in a desired shape between the die pad and a lead of a leadframe; (4) stitch bonding the wire to the lead of the leadframe; and (5) severing the wire. In forming the bonds between (a) the ends of the wire loop and (b) the bond site (e.g., a die pad, a lead, etc.) varying types of bonding energy may be used including, for example, ultrasonic energy, thermosonic energy, thermocompressive energy, amongst others.

The complexity of devices that utilize wire bonding techniques continues to increase, and the complexity of the techniques used to form wire loops also continues to increase. Unfortunately, in certain wire loop shapes, conventional wire looping techniques result in problems such as (a) wire sway, (b) low number of units per hour processed (i.e., UPH), (c) sagging wire loops, particularly adjacent both sides of the last kink of the wire loop, and (d) loops with high "humps."

Thus, it would be desirable to provide improved methods of forming wire loops.

SUMMARY OF THE INVENTION

According to an exemplary embodiment of the present invention, a method of forming a bend in a wire loop is provided. The method includes the steps of: (1) forming a first bend in the wire loop at a predetermined portion of the wire loop; (2) paying out a length of wire after step (1); and (3) forming a second bend in the wire loop at the predetermined portion after step (2).

According to another exemplary embodiment of the present invention, a method of forming a wire loop to provide interconnection between a first bonding location and a second bonding location is provided. The method includes the steps of: (1) forming a first bond at the first bonding location with a bonding tool such that a wire engaged with the bonding tool is continuous with the first bond; (2) forming a bend in the wire after step (1); (3) forming a second bond at the second bonding location such that the wire is continuous from the first bond to the second bond; and (4) severing the wire such that a length of wire engaged in the bonding tool is separated from the wire loop formed in steps (1), (2), and (3). Step (2) includes (a) forming a first bend in the wire at a predetermined portion of the wire, (b) paying out a length of wire after step (a), and (c) forming a second bend in the wire at the predetermined portion after step (b).

The methods of the present invention may also be embodied as an apparatus (e.g., as part of the intelligence of a wire bonding machine), or as computer program instructions on a computer readable carrier (e.g., a computer readable carrier used in connection with a wire bonding machine).

According to yet another exemplary embodiment of the present invention, a wire loop providing interconnection between a first bonding location and a second bonding location is provided. The wire loop includes a first bond portion bonded to the first bonding location, a second bond portion bonded to the second bonding location, and a length of wire extending between the first bond portion and the second bond portion. The length of wire includes a bend. The bend includes (1) a first bend portion in the wire loop at a predetermined portion of the wire loop, (2) a first short length of wire, and (3) a second bend portion in the wire loop at the predetermined portion such that the first short length of wire extends between the first bend portion and the second bend portion.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

U.S. Pat. Nos. 5,205,463 and 6,062,462 relate to wire bonding technology, and are herein incorporated by reference in their entirety.

According to an exemplary embodiment of the present invention, multiple bending motions (along with multiple wire payout motions) are used to form a bend in a wire loop at a predetermined portion of the wire loop. For example, the multiple bending motions (and multiple wire payout motions) may be used to achieve an angle of increased magnitude at the bend of the wire loop. Further, the multiple bending motions (and multiple wire payout motions) may be used to improve wire loop consistency and to decrease wire loop sway.

For example, according to an exemplary embodiment of the present invention, in order to form a bend in a wire loop at a predetermined portion of the wire loop, a first payout motion pays out the wire length to an initial bending point where a first bend is formed. The $2^{nd}$ through nth payout motions (which may be in a range of, for example, 3-10 mils, and more preferably in a range of 5-7 mils) tend to be relatively small payout motions followed by multiple smaller bending motions. Of course, the amount of wire payout in the $2^{nd}$ through nth payout motions may depend on the thickness of the wire being used, as a relatively thick wire may have larger payout lengths in order to subsequently bend the wire in comparison to a relatively thin wire. Such a technique (multiple small wire payout motions and bending motions) tends to form a well controlled rounded bend.

Figure 1A:
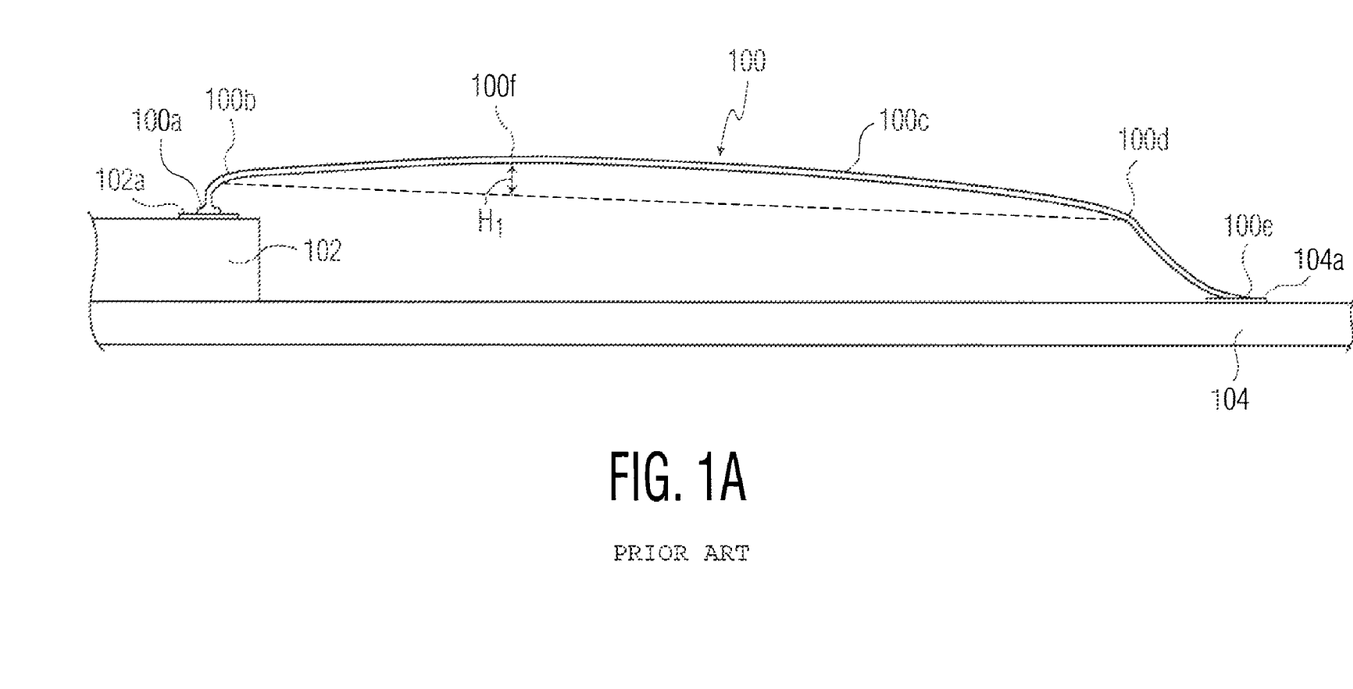
FIG. 1A is a side view of a conventional wire loop.

FIG. 1A is a side view of wire loop 100 which provides electrical interconnection between (1) bond pad 102a of semiconductor die 102 and (2) lead 104a of leadframe 104. As is known to those skilled in the art, a semiconductor die (e.g., semiconductor die 102 illustrated in FIG. 1A) is often die bonded to a surface of a leadframe (e.g., leadframe 104 illustrated in FIG. 1A) and thereafter certain die pads of the semiconductor device (e.g., die pad 102a) may be electrically interconnected to leads of the leadframe (e.g., lead 104a) through the use of wire loops (e.g., wire loop 100).

As shown in FIG. 1A, wire loop 100 may be characterized as including certain portions including (a) first bond 100a (e.g., a free air ball that has been bonded to die pad 102a), (b) bend 100b, (c) length 100c, (d) bend 100d, and (e) second bond 100e (e.g., a stitch bond on lead 104a). In conventional wire loops such as wire loop 100, one problem that may exist is a "hump" in the wire such as wire hump 100f shown in FIG. 1. For example, height "H1" (i.e., the height of wire hump 100f) may be, for example, between 2-3 mils. In certain applications, such a height H1 undesirably adds height to the wire loop.

Figure 1B:
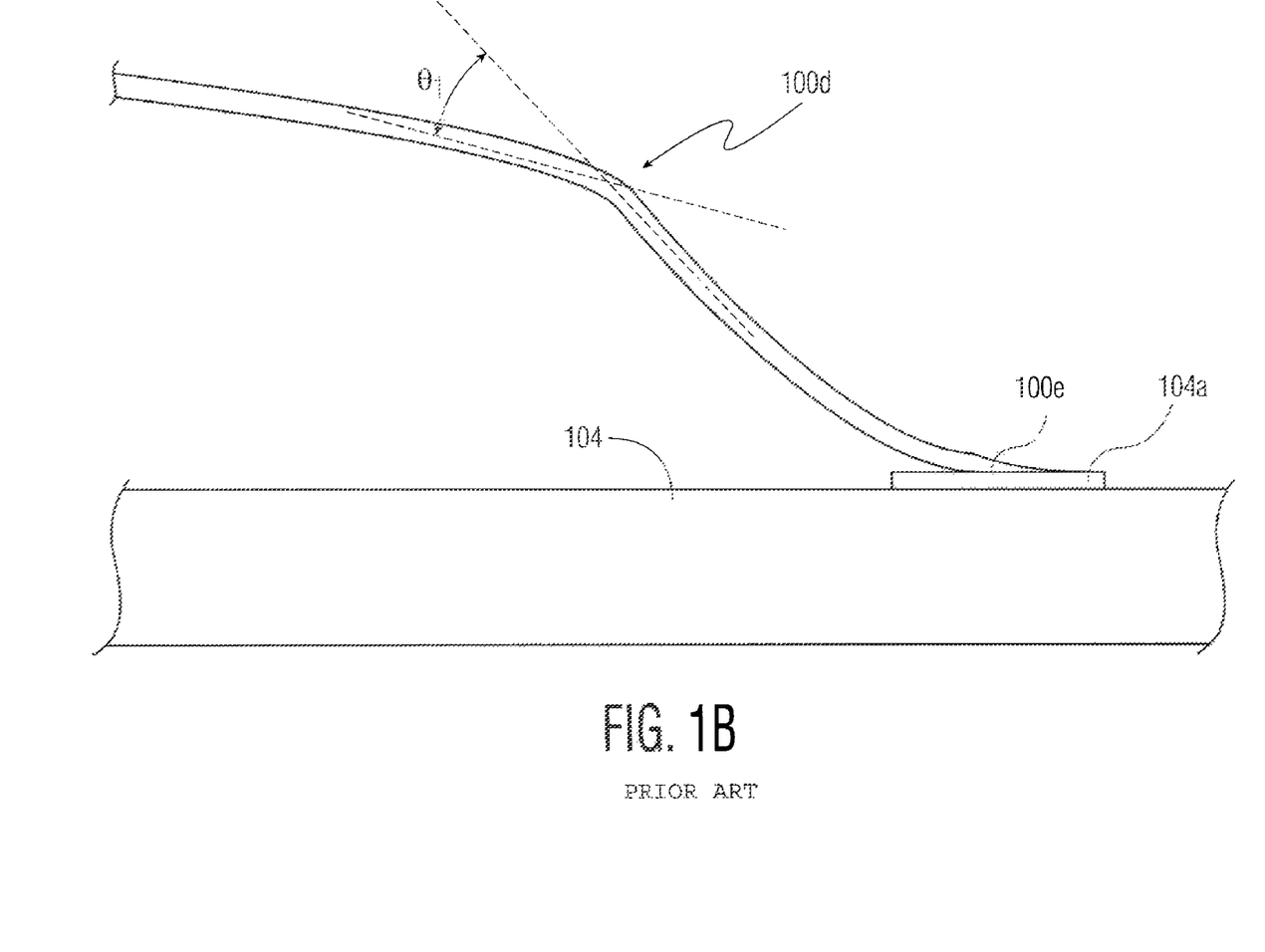
FIG. 1B is a detailed view of a portion of FIG. 1A.

FIG. 1B is a detailed view of a portion of wire loop 100 including bend 100d. As is shown in FIG. 1B, bend 100d is a single bend. Also shown in FIG. 1B is bend angle $Ø_1$. In conventional wire loops such as wire loop 100, bend angle may be smaller than is desired (e.g., smaller than is desired to provide clearance beneath the loop). Further, in order to form a bend angle of a desired magnitude with a single bending motion the bend may be too sharp, and sagging of the wire loop (particularly sagging on both sides of the bend at the last kink, that is, on both sides of bend 100d) may result, thereby reducing clearance beneath the wire loop. Further still, in order to form a bend angle of a desired magnitude with a single bending motion the amount of travel to form such a bend may subsequently result in a portion of the wire undesirably extending back into the tip of the bonding tool which can cause a number of problems.

Figure 1C:
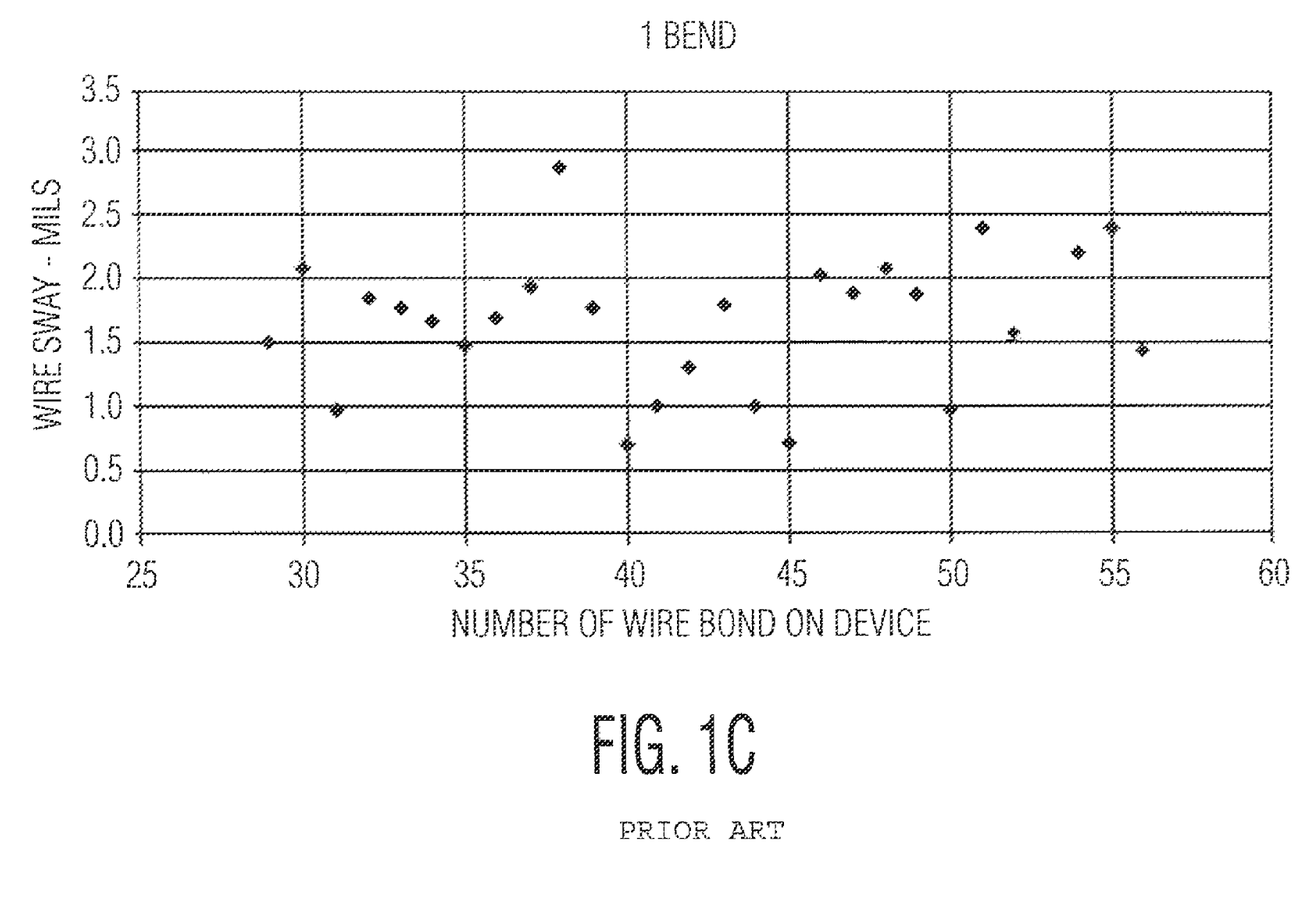
FIG. 1C is a chart illustrating wire sway of a number of wire loops formed as shown in FIG. 1A.

As is known to those skilled in the art, wire sway is a term that relates to movement of wire loops (e.g., lateral movement of the wire loops) where such movement deviates from the predetermined shape and location of the wire loop. For example, wire sway may result in adjacent wire loops short circuiting, amongst other problems. FIG. 1C is a chart illustrating wire sway (in mils) of a number of wire loops formed as shown in FIGS. 1A-1B. The wire loops that were tested for wire sway are indicated on the x-axis (i.e., wire loops 29-56 of the device were tested). As shown in FIG. 1C, a number of the wire loops tested had wire sway values that exceed 2 mils.

Figure 2A:
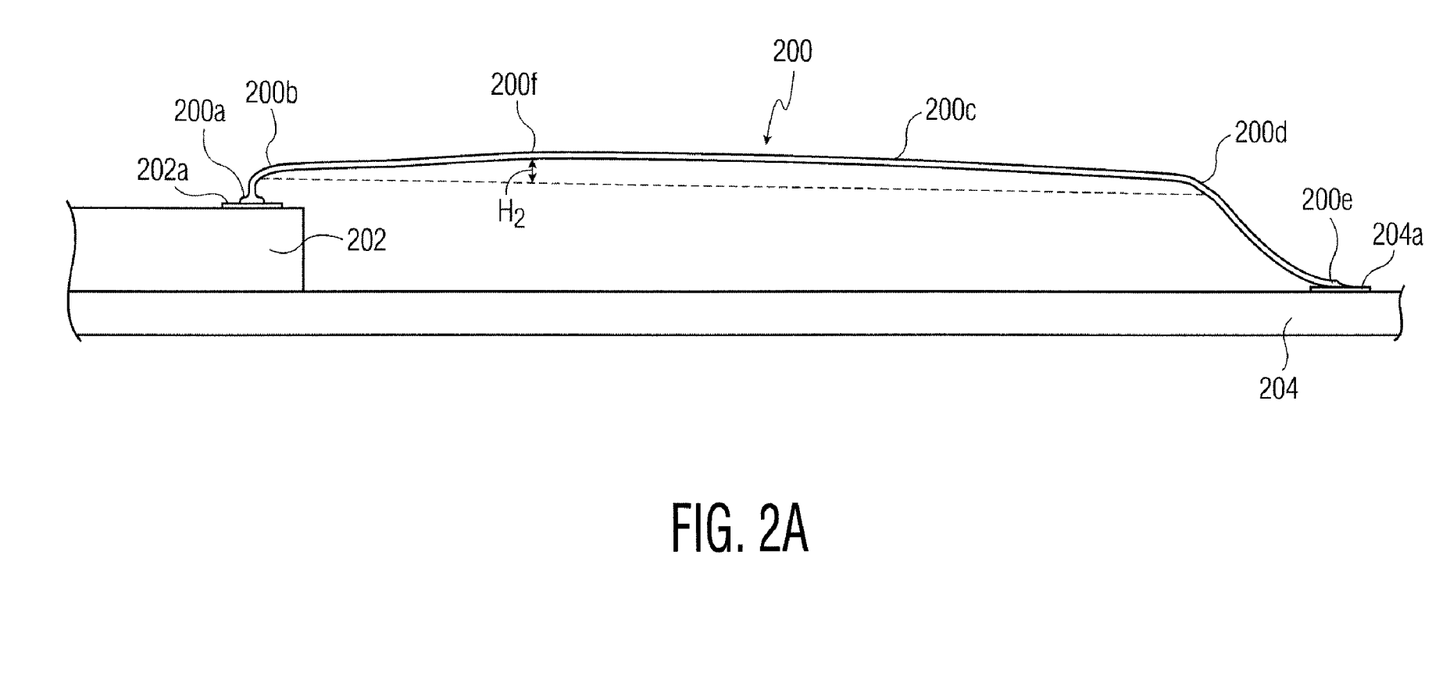
FIG. 2A is a side view of a wire loop formed in accordance with an exemplary embodiment of the present invention.

FIG. 2A is a side view of wire loop 200 formed in accordance with an exemplary embodiment of the present invention. Wire loop 200 provides electrical interconnection between (1) bond pad 202a of semiconductor die 202 and (2) lead 204a of leadframe 204. Wire loop 200 may be characterized as including certain portions including (a) first bond 200a (e.g., a free air ball that has been bonded to die pad 202a), (b) bend 200b, (c) length 200c, (d) bend 200d, and (e) second bond 200e (e.g., a stitch bond on lead 204a).

As may be seen by comparing (1) wire loop 200 formed according to an exemplary embodiment of the present invention to (2) wire loop 100 illustrated in FIG. 1A, wire hump 200f of wire loop 200 desirably has a smaller height than wire hump 100f of wire loop 100 (i.e., H2 in FIG. 2A is less than H1 in FIG. 1A).

Figure 2B:
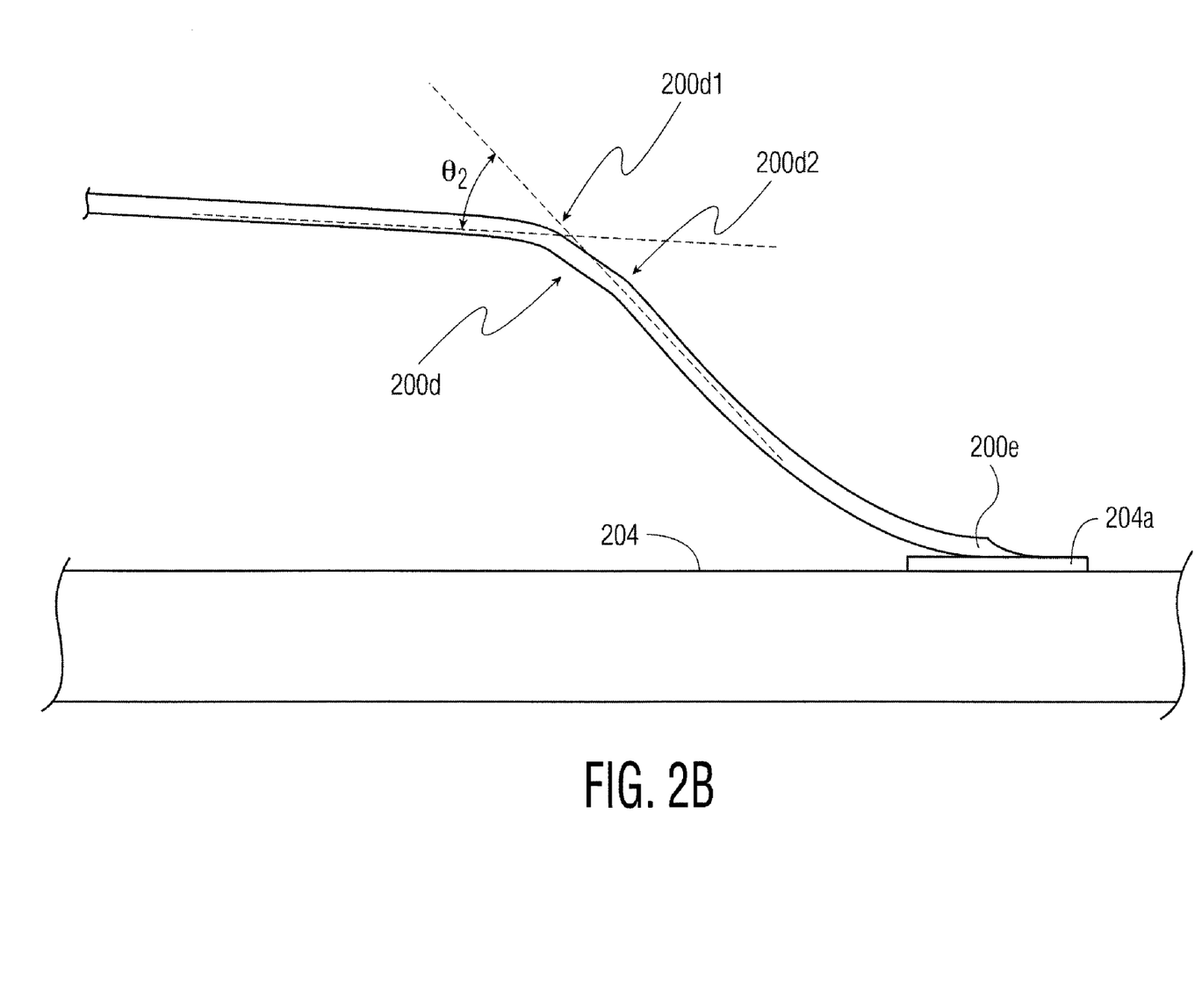
FIG. 2B is a detailed view of a portion of FIG. 2A.

FIG. 2B is a detailed view of a portion of wire loop 200 including bend 200d. As is shown in FIG. 2B, bend 200d is formed at a predetermined portion of wire loop 200 and is a "double" bend. More specifically, during shaping of wire loop 200, in order to form bend 200d, a series of steps (as opposed to a single bend motion) occurs. Bend 200d includes first bend 200d1 and second bend 200d2. To form bend 200d, a first payout motion pays out the wire length to the initial bending point, and then first bend 200d1 is formed. Subsequently, a second payout motion pays out a small length of wire (e.g., 3-10 mils of wire, and preferably 5-7 mils of wire). Then, after the small length of wire is payed out, second bend 200d2 is formed.

By forming bend 200d in this manner, an improved wire loop 200 is provided. For example, wire loop 200 tends to have less potential for wire sway in comparison to wire loop 100 illustrated in FIG. 1. Further, this technique also tends to result in wire loops having straighter profiles. Further still, as provided above, wire hump 200f of wire loop 200 has a smaller height H2 than height H1 of wire hump 100f of wire loop 100. Further still, the bend angle $Ø_2$ is larger than $Ø_1$. A larger bend angle may be desired in many applications, for example, to provide greater clearance (1) to lower tier wires, or (2) to a die edge as in a stacked die package.

Figure 2C:
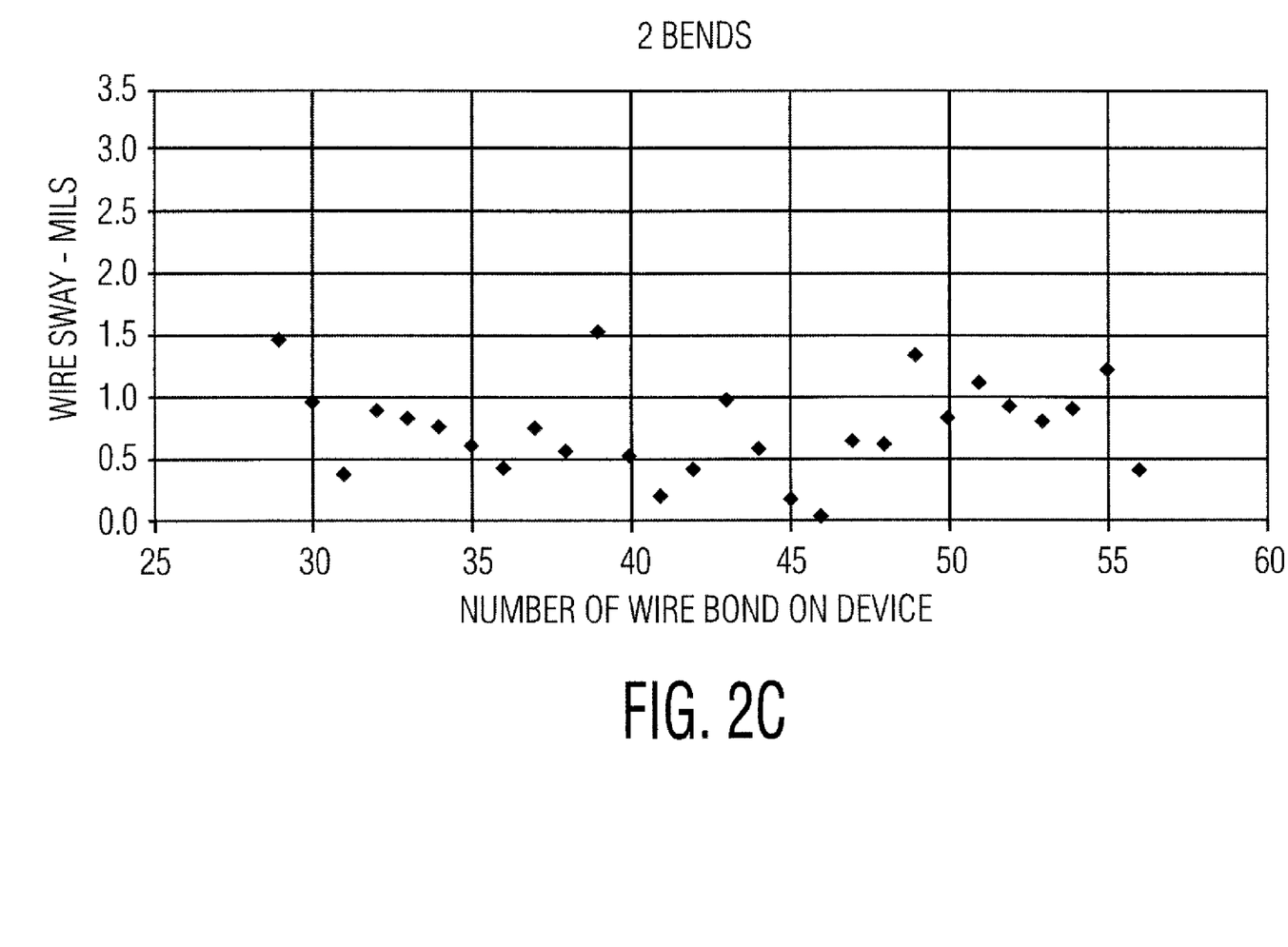
FIG. 2C is a chart illustrating wire sway of a number of wire loops formed as shown in FIG. 2A.

FIG. 2C is a chart illustrating wire sway (in mils) of a number of wire loops formed as shown in FIGS. 2A-2B. The wire loops that were tested for wire sway are indicated on the x-axis (i.e., wire loops 29-56 of the device were tested). As shown in FIG. 2C, none of the wire loops tested had wire sway values that exceed 2 mils, and in fact, the highest wire sway value is approximately 1.5 mils.

Of course, the present invention is not limited to forming a bend in a wire loop with two bending motions. Any number of bending motions (and corresponding wire pay outs) may be used to form the desired bend. For example, FIGS. 3A-3B illustrate a bend 300d formed with three bending motions.

Figure 3A:
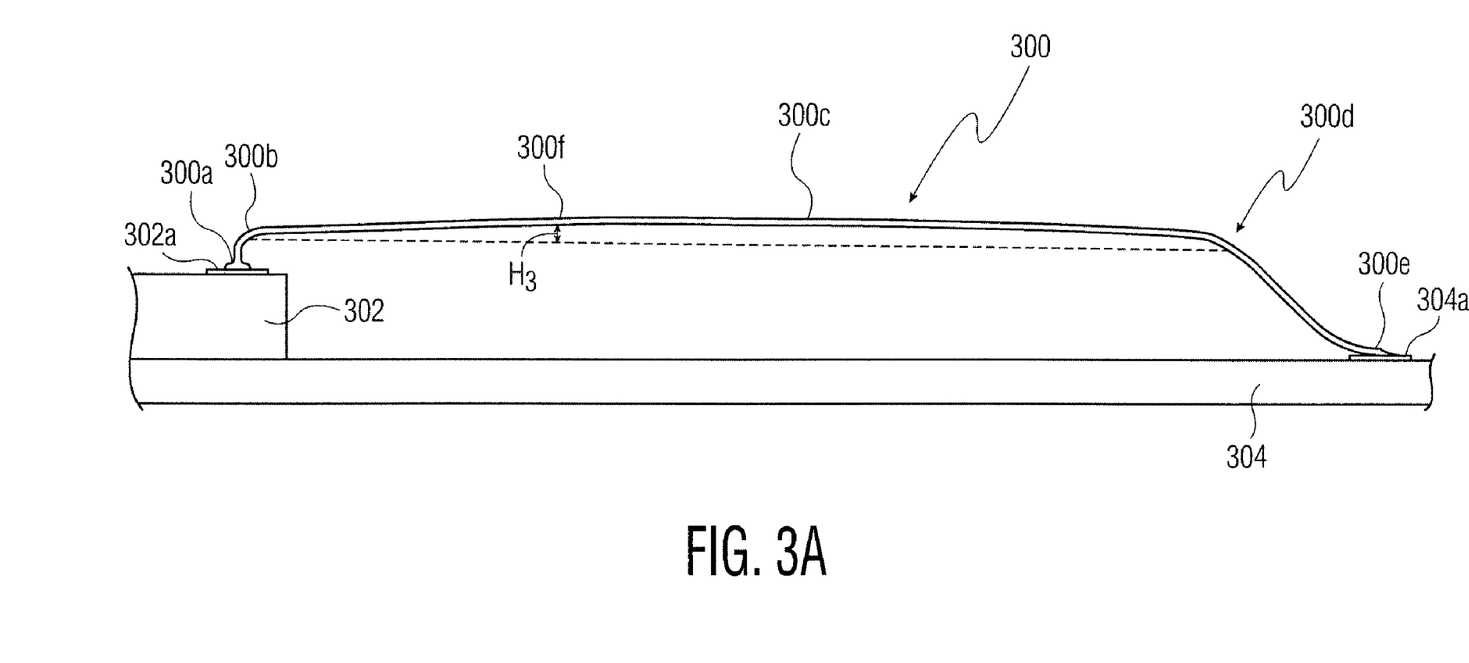
FIG. 3A is a side view of another wire loop formed in accordance with another exemplary embodiment of the present invention.

More specifically, FIG. 3A is a side view of wire loop 300 formed in accordance with another exemplary embodiment of the present invention. Wire loop 300 provides electrical interconnection between (1) bond pad 302a of semiconductor die 302 and (2) lead 304a of leadframe 304. Wire loop 300 may be characterized as including certain portions including (a) first bond 300a (e.g., a free air ball that has been bonded to die pad 302a), (b) bend 300b, (c) length 300c, (d) bend 300d, and (e) second bond 300e (e.g., a stitch bond on lead 204a).

Figure 3B:
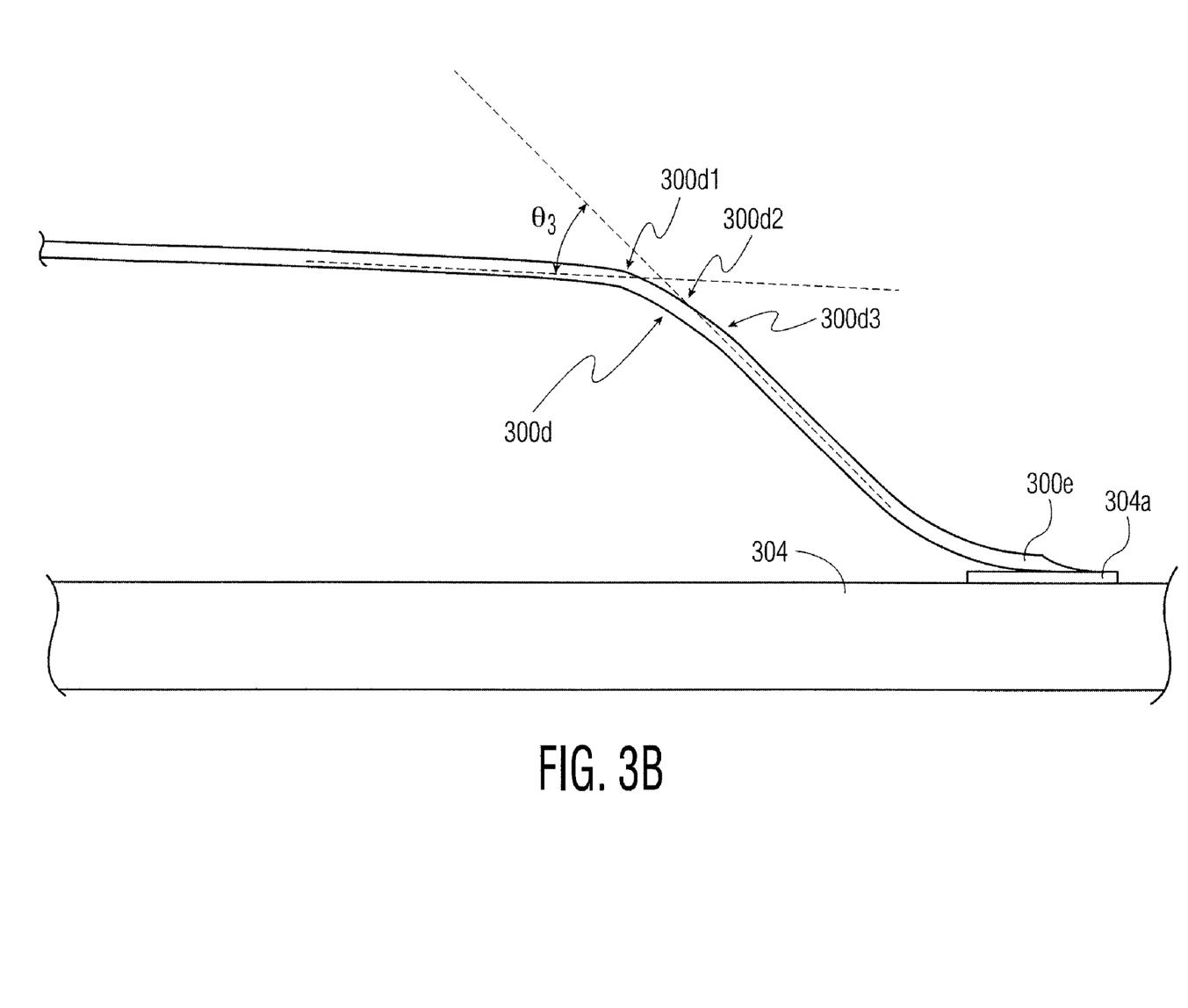
FIG. 3B is a detailed view of a portion of FIG. 3A.

FIG. 3B is a detailed view of a portion of wire loop 300 including bend 300d. As is shown in FIG. 3B, bend 300d is formed at a predetermined portion of wire loop 300 and is a "triple" bend. More specifically, during shaping of wire loop 300, in order to form bend 300d, a series of steps occurs. Bend 300d includes first bend 300d1, second bend 300d2, and third bend 300d3. To form bend 300d, a first payout motion pays out the wire length to the initial bending point, and then first bend 300d1 is formed. Subsequently, a second payout motion pays out a small length of wire (e.g., 3-10 mils of wire, and preferably 5-7 mils of wire). Then, after the small length of wire is payed out, second bend 300d2 is formed. Then a third payout motion pays out another small length of wire (e.g., 3-10 mils of wire, and preferably 5-7 mils of wire). After the another small length of wire is payed out, third bend 300d3 is formed.

By forming bend 300d in this manner, an improved wire loop 300 is provided. For example, wire loop 300 tends to have less potential for wire sway in comparison to wire loop 100 illustrated in FIG. 1. Further, height H3 of wire hump 300f of wire loop 300 is smaller than height H1 of wire hump 100f of wire loop 100. Further still, the bend angle $Ø_3$ is larger than $Ø_1$ and $Ø_2$.

Figure 3C:
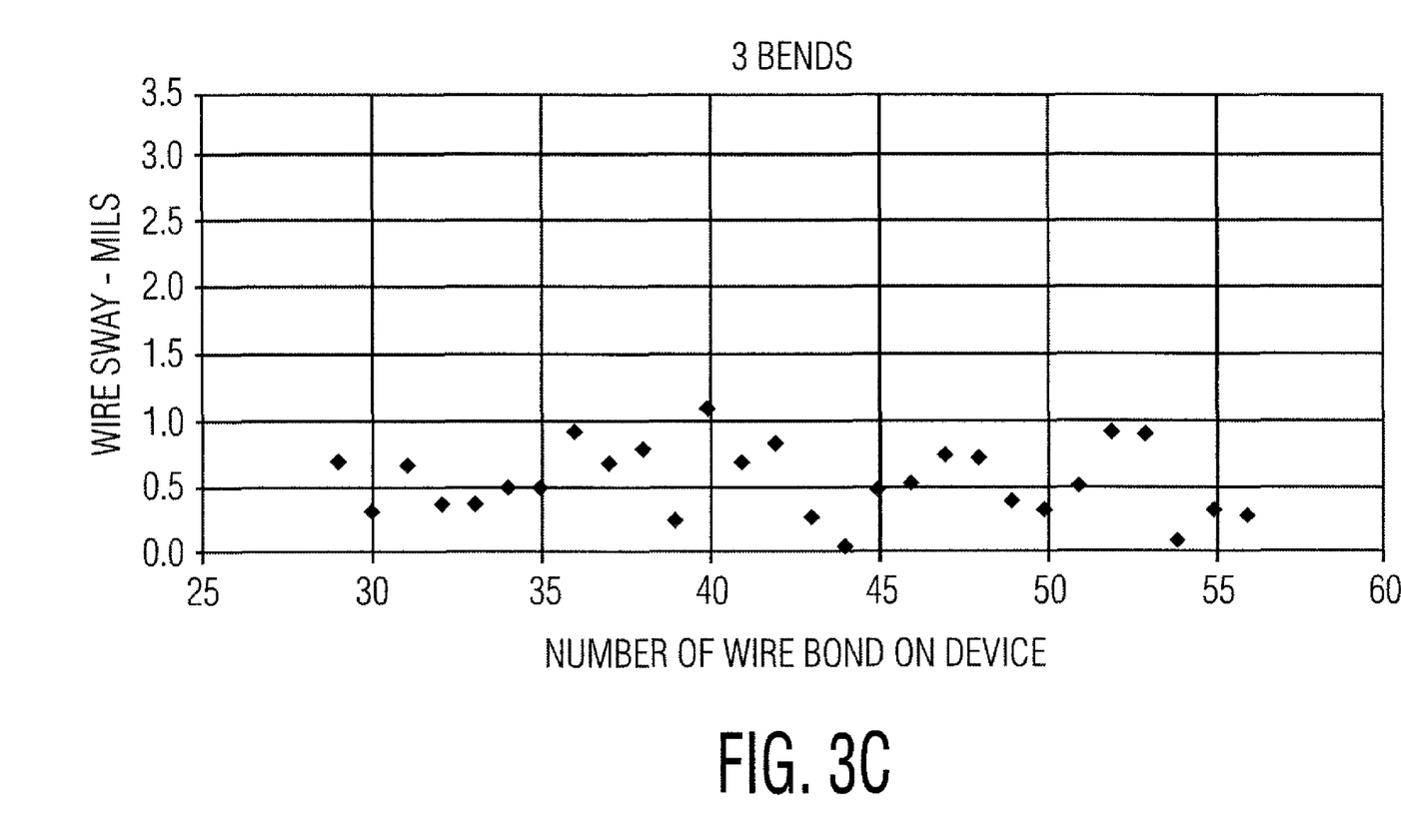
FIG. 3C is a chart illustrating wire sway of a number of wire loops formed as shown in FIG. 3A.

FIG. 3C is a chart illustrating wire sway (in mils) of a number of wire loops formed as shown in FIGS. 3A-3B. The wire loops that were tested for wire sway are indicated on the x-axis (i.e., wire loops 29-56 of the device were tested). As shown in FIG. 3C, none of the wire loops tested had wire sway values that exceed 1.5 mils, and in fact, the highest wire sway value is slightly above 1 mil.

Thus, in certain wire bonding applications a single bending motion may be limited in providing a stable bend (and thus potentially compromising the stability of the resultant wire loop). Using multiple bends in a defined small region (i.e., the predetermined portion of the wire loop where a bend is to be formed) can form a larger bend (e.g., a larger bend angle) while avoiding certain potential stability issues in the wire loop. According to the present invention, multiple bending motions (and corresponding wire payout motions) are utilized to form an improved bend, and hence, an improved wire loop. The multiple bending motions (and associated wire payout motions) tend to form a well controlled rounded bend in the wire loop, in contrast to the sharp bends formed according to conventional techniques.

Figure 4:
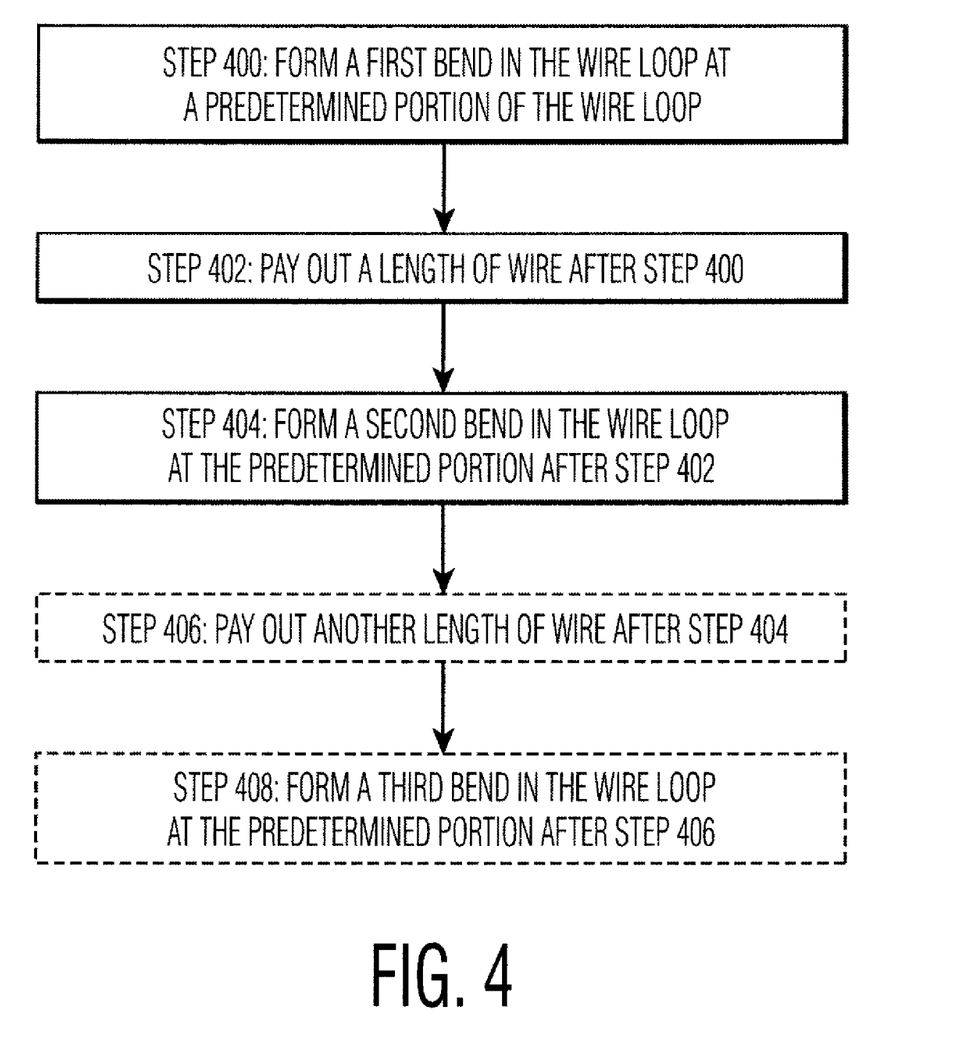
FIG. 4 is a flow diagram illustrating a method of forming a bend in a wire loop in accordance with an exemplary embodiment of the present invention.
Figure 5:
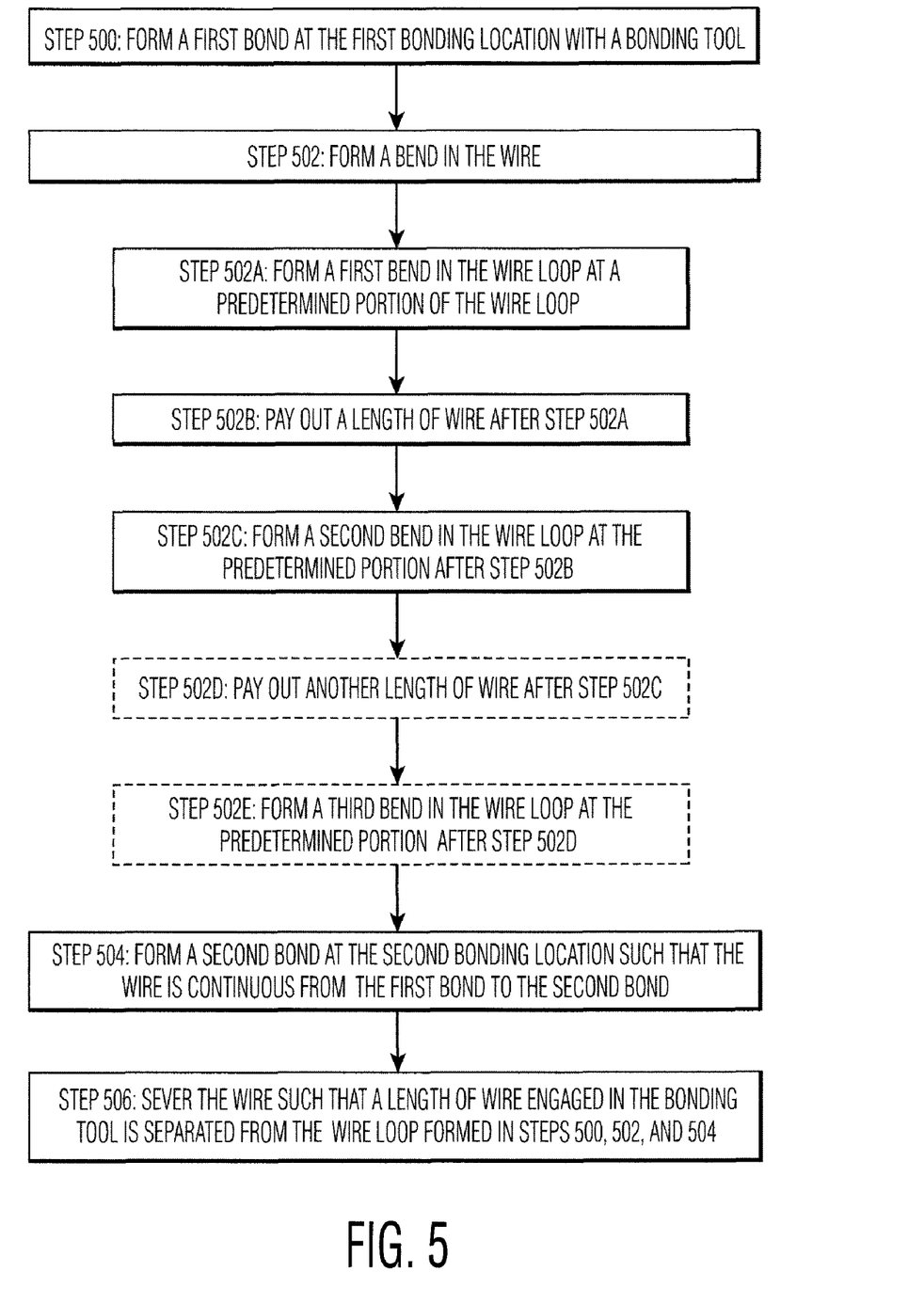
FIG. 5 is a flow diagram illustrating a method of forming a wire loop to provide interconnection between a first bonding location and a second bonding location in accordance with an exemplary embodiment of the present invention.

FIGS. 4-5 are flow diagrams in accordance with certain exemplary embodiments of the present invention. As is understood by those skilled in the art, certain steps included in the flow diagrams may be omitted; certain additional steps may be added; and the order of the steps may be altered from the order illustrated.

FIG. 4 is a flow diagram illustrating a method of forming a bend in a wire loop in accordance with an exemplary embodiment of the present invention. At step 400, a first bend is formed in the wire loop at a predetermined portion of the wire loop. For example, in FIG. 2B, the first bend is bend 200d1. Likewise, in FIG. 3B, the first bend is bend 300d1. At step 402, a length of wire (e.g., 3-10 mils of wire, and preferably 5-7 mils of wire) is payed out after step 400. At step 404, a second bend is formed in the wire loop at the predetermined portion after step 402. For example, in FIG. 2B, the second bend is bend 200d2. Likewise, in FIG. 3B, the second bend is bend 300d2. At optional step 406, a length of wire (e.g., 3-10 mils of wire, and preferably 5-7 mils of wire) is payed out after step 404. At optional step 408, a third bend is formed in the wire loop at the predetermined portion after step 406. For example, in FIG. 3B, the third bend is bend 300d3. Of course, additional bends (and small payouts of wire) may be formed at the predetermined portion of the wire as is desired.

FIG. 5 is a flow diagram illustrating a method of forming a wire loop to provide interconnection between a first bonding location and a second bonding location in accordance with an exemplary embodiment of the present invention. At step 500, a first bond is formed at the first bonding location with a bonding tool such that a wire engaged with the bonding tool is continuous with the first bond. Following step 500 any of a number of steps may be performed prior to step 502. For example, a bend may be formed in the wire loop adjacent the first bond such as bend 200b in FIG. 2A (or bend 300b in FIG. 3A). As another example, various wire motions and/or payouts may be performed prior to step 502.

At step 502, a bend is formed in the wire. Step 502 includes a number of steps (e.g., steps 502A, 502B, 502C, etc.). At step 502A, a first bend is formed in the wire loop at a predetermined portion of the wire loop. For example, in FIG. 2B, the first bend is bend 200d1. Likewise, in FIG. 3B, the first bend is bend 300d1. At step 502B, a length of wire (e.g., 3-10 mils of wire, and preferably 5-7 mils of wire) is payed out after step 502A. At step 502C, a second bend is formed in the wire loop at the predetermined portion after step 502B. For example, in FIG. 2B, the second bend is bend 200d2. Likewise, in FIG. 3B, the second bend is bend 300d2. At optional step 502D, a length of wire (e.g., 3-10 mils of wire, and preferably 5-7 mils of wire) is payed out after step 502C. At optional step 502E, a third bend is formed in the wire loop at the predetermined portion after step 502D. For example, in FIG. 3B, the third bend is bend 300d3. Of course, additional bends (and small payouts of wire) may be formed at the predetermined portion of the wire as is desired.

Following step 502, at step 504, a second bond is formed at the second bonding location such that the wire is continuous from the first bond to the second bond. At step 506, the wire is severed such that a length of wire engaged in the bonding tool is separated from the wire loop formed in steps 500, 502, and 504.

As provided above, the present invention forms a bend in a wire loop by making a series of bends and payout motions at a predetermined portion of the wire. Each of these multiple payout motions may be of the same magnitude, or they may be of varying magnitudes. Likewise, each of the series of bends formed in the wire at the predetermined portion of the wire may be of the same magnitude (the same bend angle), or the bends may have different magnitudes (e.g., different bend angles). In certain applications it has been determined that the multiple bending motions after the first bend may be of smaller angles, for example, each subsequent bend being between 5-10 degrees. Thus, the first bend (e.g., bend 200d1 in FIG. 2B) may be formed in the wire at a bend angle in a range of between, for example, 30-80 degrees (e.g., 50 degrees). Thereafter, the second bend may be formed in the wire at a bend angle of a few degrees (e.g., 8 degrees). Of course, these bend angles (i.e., 30-80 degrees, 50 degrees, 5-10 degrees, and 8 degrees) are exemplary in nature and the bend angles are often customized for the particular application.

Although the present invention has been described primarily with respect to a bend at the so-called "last kink" of a wire loop (e.g., bends 200d and 300d may be classified by some in the art as the last kink as they are the last bend before second bond), it is not limited thereto. The teachings of the present invention may be applied to any bend in a wire loop. For example, the techniques disclosed herein may be applied to bend 100b of FIG. 1A (or likewise to bend 200b of FIG. 2A or bend 300b of FIG. 3A). Other more complicated loops may have multiple bends (e.g., horizontal bends, vertical bends, or bends having both horizontal and vertical components), and the teachings of the present invention may be applied to any of these bends.

Although the present invention has been illustrated and described primarily in connection with conventional forward looping techniques (i.e., a wire loop with a first ball bond formed on a semiconductor die and a second stitch bond formed on a leadframe), it is not limited thereto. The teachings of the present invention may be applied to any looping technique such as reverse bonding, stand-off stitch bonding, die-to-die bonding, stacked die bonding, and any other wire looping technique. In fact, the teachings of the present invention have been found to have excellent results in stacked die bonding.

The techniques of the present invention (e.g., wire bending techniques, wire bonding techniques, etc.) may be implemented in a number of alternative mediums. For example, the techniques can be installed on an existing computer system/server as software (a computer system used in connection with, or integrated with, a wire bonding machine). Further, the techniques may operate from a computer readable carrier (e.g., solid state memory, optical disc, magnetic disc, radio frequency carrier medium, audio frequency carrier medium, etc.) that includes computer instructions (e.g., computer program instructions) related to the techniques.

Although the invention is illustrated and described herein with reference to specific embodiments, the invention is not intended to be limited to the details shown. Rather, various modifications may be made in the details within the scope and range of equivalents of the claims and without departing from the invention.

The invention claimed is:

1. A wire loop providing interconnection between a first bonding location and a second bonding location, the wire loop comprising:
   a first bond portion bonded to the first bonding location;
   a second bond portion bonded to the second bonding location; and
   a length of wire extending between the first bond portion and the second bond portion, the length of wire including a bend, the bend being between and away from each of the first bond portion and the second bond portion, the bend including:
   (1) a first bend portion of the bend in the wire loop at a predetermined portion of the wire loop,
   (2) a first length of wire, and
   (3) a second bend portion of the bend in the wire loop at the predetermined portion such that the first length of wire extends between the first bend portion and the second bend portion, each of the first bend portion and the second bend portion being part of the bend.

2. The wire loop of claim 1 wherein the bend further includes: (4) a second length of wire, and (5) a third bend portion of the bend in the wire loop at the predetermined portion such that the second length of wire extends between the second bend portion of the bend and the third bend portion of the bend.

3. The wire loop of claim 1 wherein the first length of wire is in a range of between 3-10 mils.

4. The wire loop of claim 1 wherein the first length of wire is in a range of between 5-7 mils.

5. A method of forming a wire loop to provide interconnection between a first bonding location and a second bonding location, the method comprising the steps of:
   (1) forming a first bond at the first bonding location with a bonding tool such that a wire engaged with the bonding tool is continuous with the first bond;
   (2) forming a bend in the wire after step (1), the step of forming a bend including:
      (a) forming a first bend portion of the bend in the wire at a predetermined portion of the wire, the predetermined portion being between and away from each of the bonding location and the second bonding location,
      (b) paying out a length of wire after step (a), and
      (c) forming a second bend portion of the bend in the wire at the predetermined portion after step (b), each of the first bend portion and the second bend portion being part of the bend formed in step (2);
   (3) forming a second bond at the second bonding location such that the wire is continuous from the first bond to the second bond; and
   (4) severing the wire such that a length of wire engaged in the bonding tool is separated from the wire loop formed in steps (1), (2), and (3).

6. The method of claim 5 further comprising the step of (5) forming another bend in the wire prior to step (3), the another bend in the wire being adjacent the first bond.

7. The method of claim 5 wherein step (2) further comprises the steps of (d) paying out another length of wire after step (c), and (e) forming a third bend portion of the bend in the wire at the predetermined portion after step (d).

8. The method of claim 5 wherein step (b) comprises paying out the length of wire after step (a) such that the length of wire is in a range of between 3-10 mils.

9. The method of claim 5 wherein step (b) comprises paying out the length of wire after step (a) such that the length of wire is in a range of between 5-7 mils.

* * * * *